United States Patent
Tay et al.

(10) Patent No.: US 6,707,011 B2
(45) Date of Patent: Mar. 16, 2004

(54) RAPID THERMAL PROCESSING SYSTEM FOR INTEGRATED CIRCUITS

(75) Inventors: Sing-Pin Tay, Fremont, CA (US); Yao Zhi Hu, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/272,462

(22) Filed: Oct. 16, 2002

(65) Prior Publication Data

US 2003/0094446 A1 May 22, 2003

Related U.S. Application Data

(63) Continuation-in-part of application No. 09/836,098, filed on Apr. 17, 2001.

(51) Int. Cl.[7] .................................................. F27B 5/14
(52) U.S. Cl. .................... 219/411; 219/390; 219/405; 392/416; 392/418; 118/724; 118/725; 118/50.1
(58) Field of Search ................................. 219/390, 405, 219/411; 392/416, 418; 118/724, 725, 50.1

(56) References Cited

U.S. PATENT DOCUMENTS

| 5,154,512 A | 10/1992 | Schietinger et al. |
|---|---|---|
| 5,180,226 A | 1/1993 | Moslehi |
| 5,879,574 A | 3/1999 | Sivaramakrishnan et al. |
| 5,899,735 A | 5/1999 | Tseng |
| 5,963,840 A | 10/1999 | Xia et al. |
| 5,968,587 A | 10/1999 | Frankel |
| 6,067,931 A | 5/2000 | Ghezzo et al. |
| 6,133,550 A | 10/2000 | Griffiths et al. |
| 6,191,392 B1 | 2/2001 | Hauf et al. |
| 6,369,363 B2 | 4/2002 | Hauf et al. |
| 6,399,922 B2 * | 6/2002 | Okase et al. ................. 219/405 |
| 6,410,888 B2 * | 6/2002 | Pan ............................ 219/390 |
| 6,554,905 B1 * | 4/2003 | Goodwin ..................... 118/724 |

* cited by examiner

Primary Examiner—Shawntina Fuqua
(74) Attorney, Agent, or Firm—Connolly Bove Lodge & Hutz LLP

(57) ABSTRACT

In a rapid thermal processing system an array of heat lamps generate radiant heat for heating the surfaces of a semiconductor substrate, such as a semiconductor wafer, to a selected temperature or set of temperatures while held within an enclosed chamber. The heat lamps are surrounded by one or more optically transparent enclosures that isolate the heat lamps from the chamber environment and the wafer or wafers therein. The optically transparent enclosures include associated reflectors to direct a higher proportion of emitted radiant heat energy from the lamps toward the semiconductor wafer(s). The lamps with such enclosures are mounted for rotation so that the reflectors may alternately shield all or a portion of emitted lamp radiation from the semiconductor substrate.

41 Claims, 7 Drawing Sheets

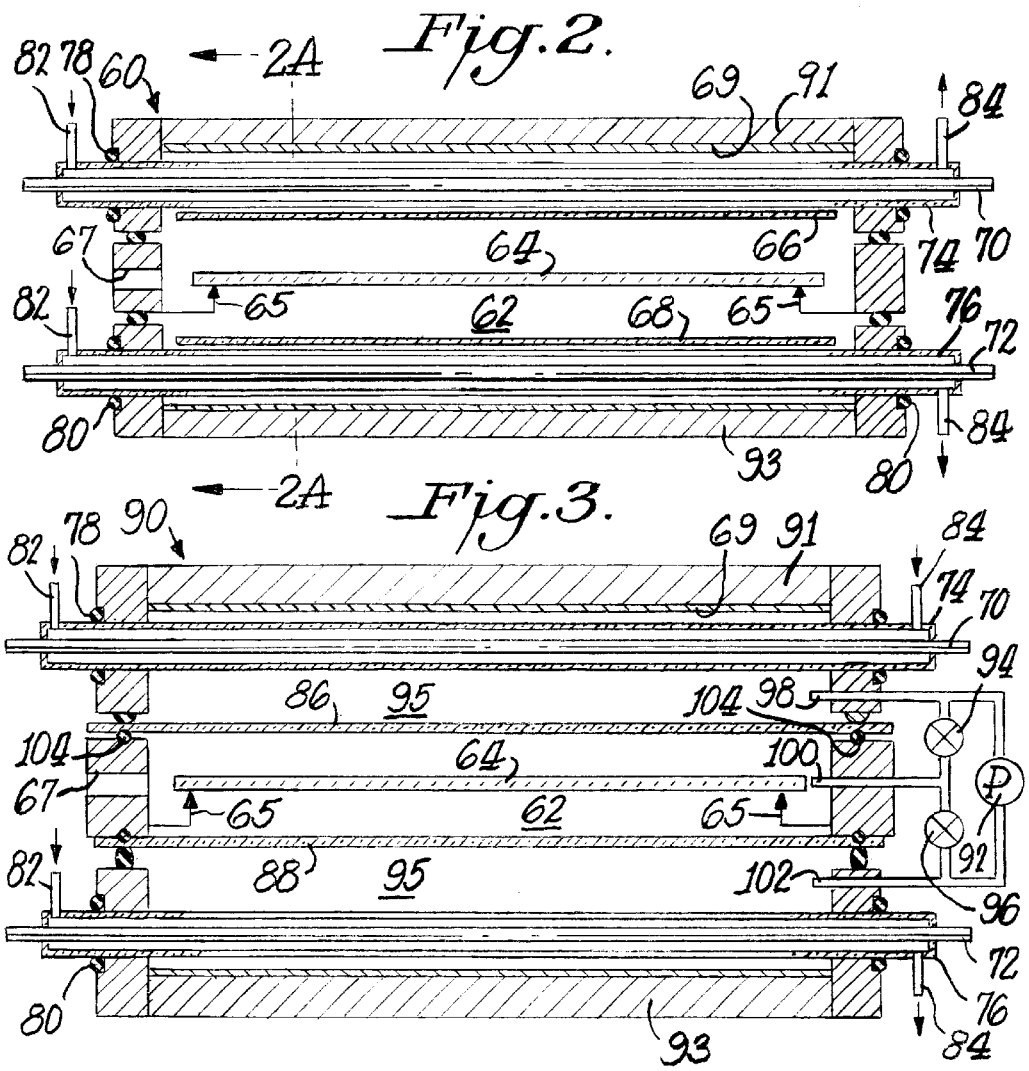
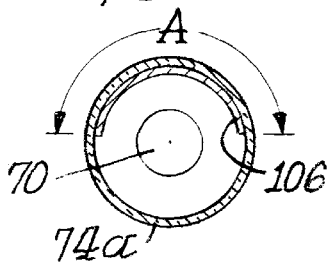
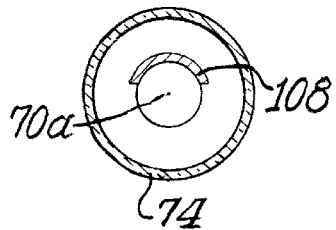

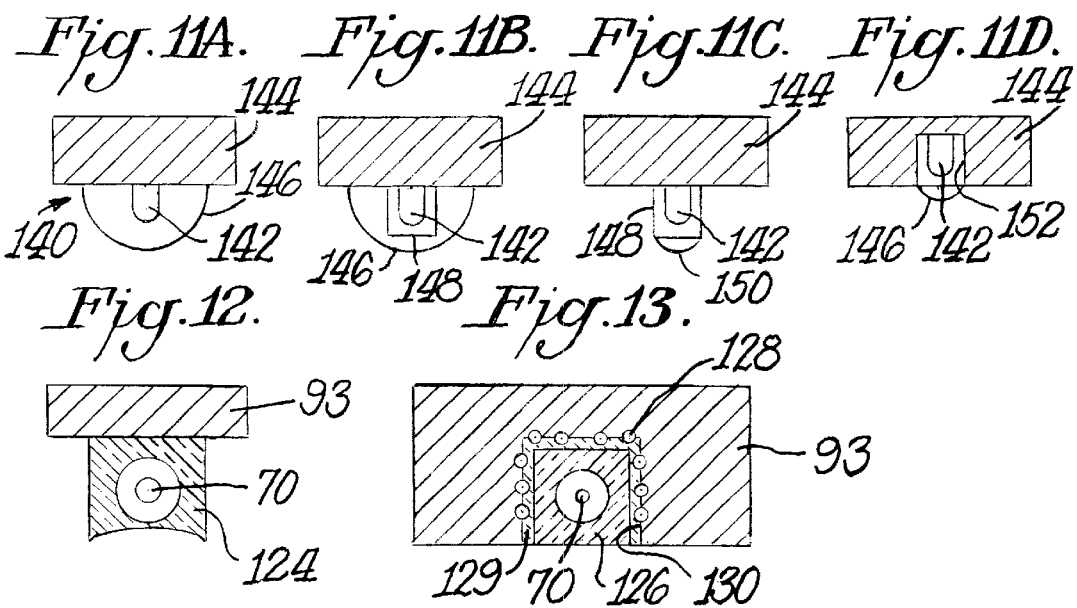
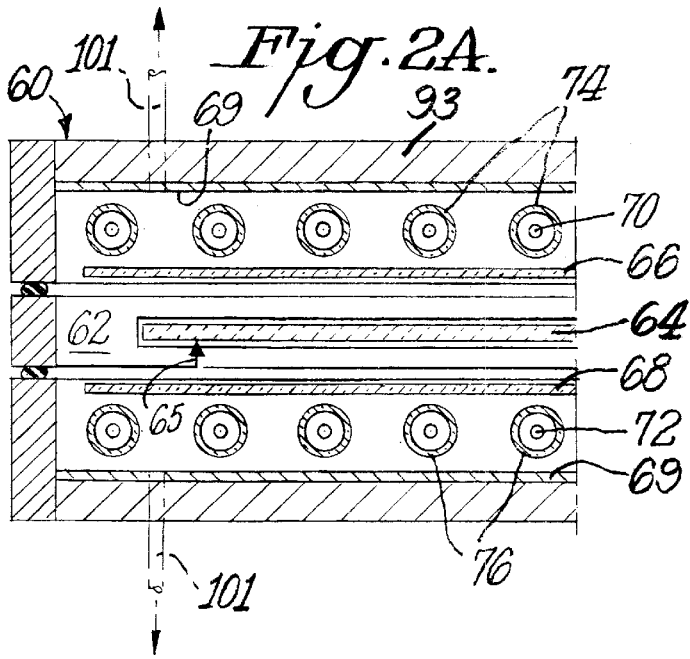

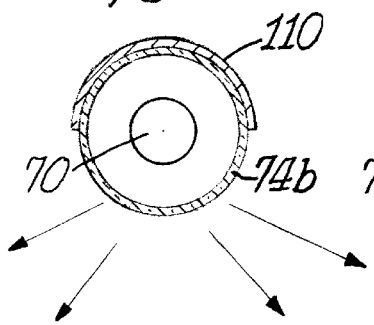
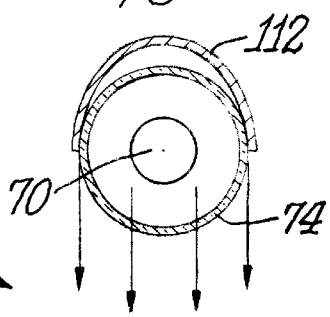
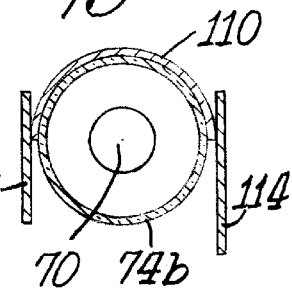
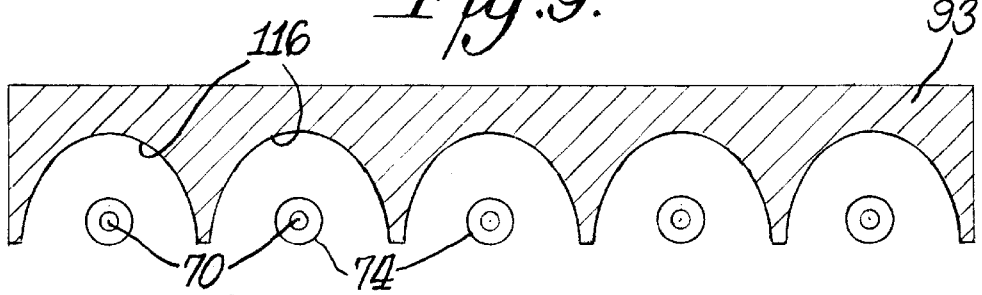
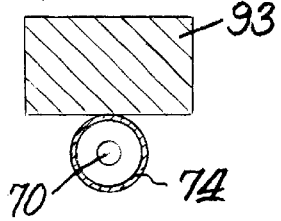
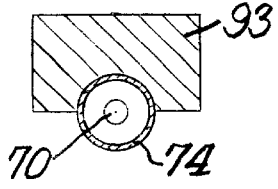
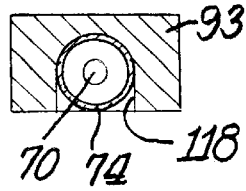
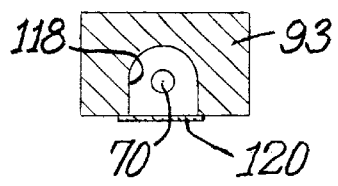
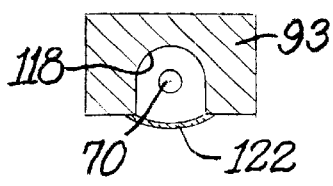
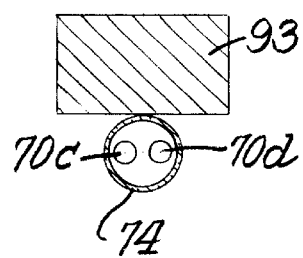

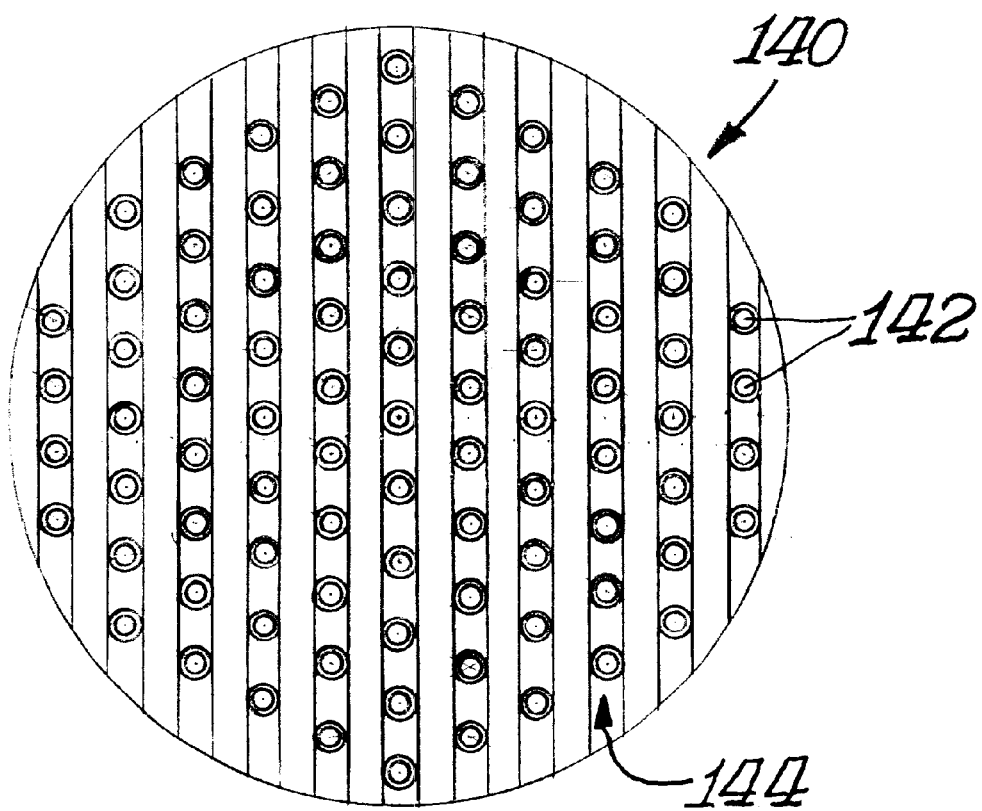

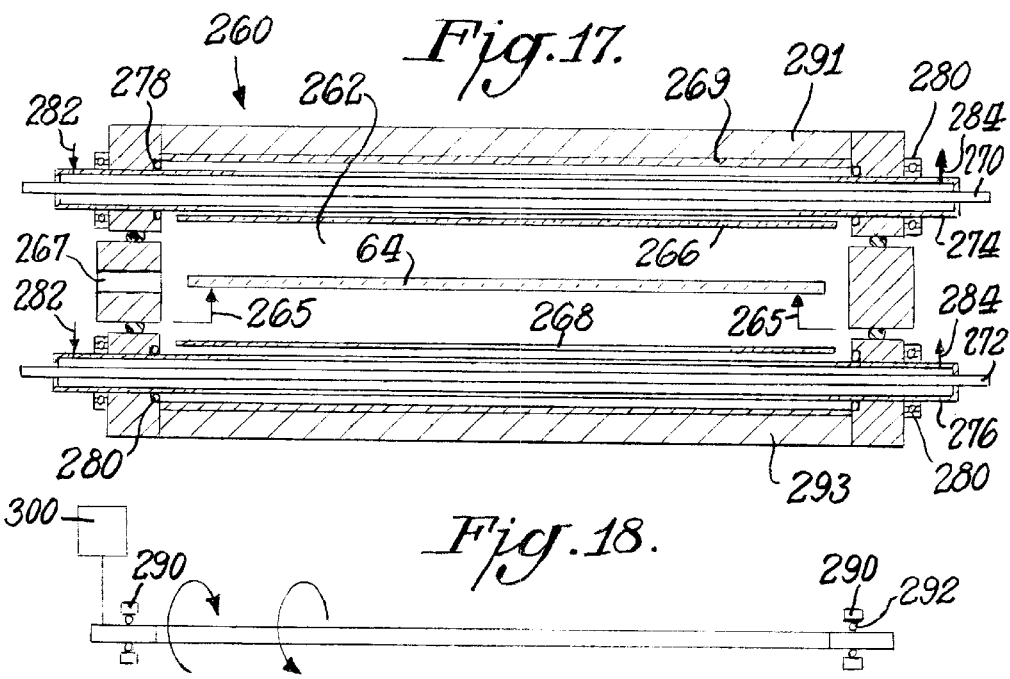
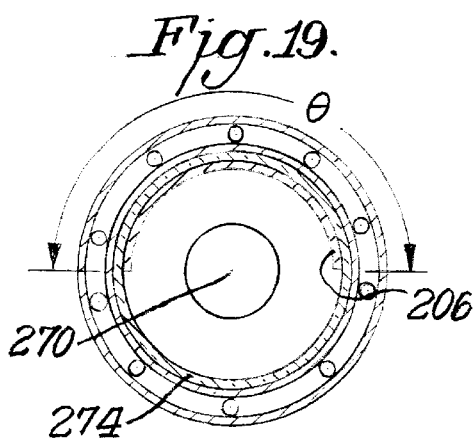
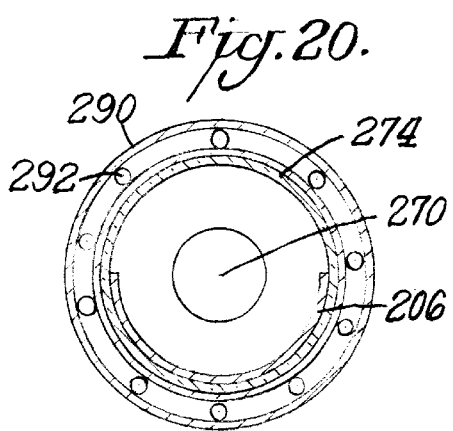
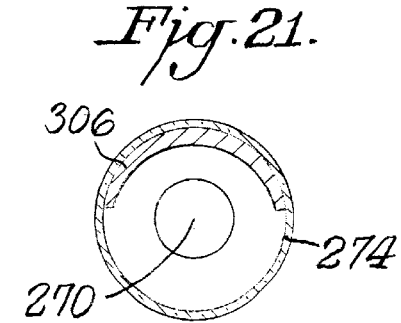
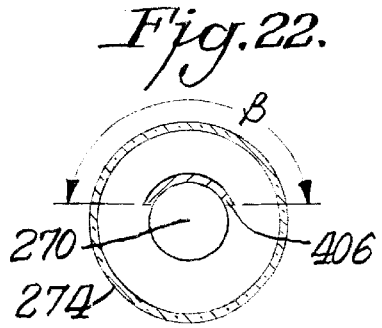

RAPID THERMAL PROCESSING SYSTEM FOR INTEGRATED CIRCUITS

CROSS REFERENCE TO RELATED APPLICATION

This application is a continuation-in-part of U.S. patent application Ser. No. 09/836,098, filed Apr. 17, 2001, now pending.

BACKGROUND OF THE INVENTION

The present invention relates to the manufacture of integrated circuits. Specifically, a system for heating semiconductor substrates in a controlled pressure and temperature environment is disclosed.

The manufacture of integrated circuits, such as metal oxide semiconductors (MOS), requires rapid thermal processing of semiconductor wafers in a controlled pressure environment, such as vacuum. For instance, in the process of forming MOS transistors, the gate oxide layer is typically formed by thermal oxidation of a silicon substrate in a substantially pure oxygen atmosphere. However, in certain applications such as MOS ULSI circuits, the gate oxide layers can exhibit undesirable characteristics, such as relatively high defect densities and charge trapping, along with relatively low reliability and resistance problems due to hot carrier effects.

It is known that the gate dielectric characteristics of MOS transistors can be improved using a sequence of rapid thermal processing (RTP) of the silicon substrate. These processing steps include: (1) creating an oxynitride growth with nitric oxide (NO); (2) applying silicon nitride (SiN) with a chemical vapor deposition (CVD) process; (3) annealing with ammonia ($NH_3$); and (4) annealing with $N_2O$. The various RTP processing steps are conducted generally in a vacuum capable chamber with a controlled pressure/vacuum and a controlled temperature. An RTP oven is partitioned with quartz windows defining a central vacuum chamber that holds a wafer to be heated by multiple arrays of radiant heating lamps. The quartz windows separate the wafers from heating lamps and other sources of contaminants during the heating process. The edges of the quartz windows are sealed with the chamber walls to form an air-tight chamber enclosure. When a vacuum is drawn in the chamber, an atmospheric force between two and four tons is produced against the quartz windows. The quartz windows are thick enough to withstand this force, and are generally at least about 25 mm to 35 mm thick. Thinner quartz windows, generally at least about 3 mm to 6 mm thick, are used only for chambers that operate at atmospheric pressures.

The quartz window isolation chamber structure, while maintaining the inner chamber environment clean of contaminants, introduces a large thermal mass between the heating source (lamps) and the wafer within the chamber, making heating less efficient and wafer temperature control more difficult. The additional thermal mass makes it difficult to maintain process repeatability and quality control. The quartz windows, due to their thickness, are subject to breakage, and add significant cost to the RTP apparatus. Accordingly, a system for rapid thermal processing which avoids the complications, expense, and repeatability problems created by quartz window-based ovens would be desirable.

Moreover, efforts to increase throughput for semiconductor wafer RTP processing have yielded certain alternatives other than lamp-based heating. Mattson Technology offers an ASPEN II RTP system that processes two wafers in a single process chamber using susceptor-based heating. U.S. Pat. No. 6,133,550 discloses a method for RTP processing wafers by rapidly inserting and removing them from a furnace. Increasing wafer size and increasing stresses on larger and larger chamber windows for chambers to accommodate larger wafers have limited the potential for increasing throughput for lamp-based RTP systems by processing multiple wafers in a chamber. Accordingly, a system for lamp-based rapid thermal processing that permits increased wafer throughput would also be desirable.

Rapid thermal processing has been used to anneal semiconductor substrates following ion implantation. In a typical rapid spike anneal, the substrate is heated to 1100° C. (in the case of silicon semiconductor wafers) at a rate of from 200° to 300° per second. Once the surface has reached the peak anneal temperature, it is cooled at rates on the order of 80° C. per second. The slower the rate of cooling, the greater the migration of the implanted species following the anneal. For example, a bare silicon wafer implanted with boron ($BF_2^+$) to a depth of about 240 Å and spike annealed at a maximum temperature of 1050° C. exhibits migration of the junction depth as a function of the ramp down rate used following the spike temperature. When cooled at a rate of between 80° C. to 120° C. per second, the junction depth increases to over 300 Å. As shallower and shallower junction depths are sought, the adverse effects of junction depth migration during treatment become more and more critical.

One factor limiting the rate at which the temperature of the semiconductor substrate surface may be cooled is the residual heating as a result of lamp filament emitting radiation following lamp shut off, which residual radiation can pass through the lamp bulb envelope or enclosure and into the chamber and reach the substrate. Because the lamp filament remains hot for fraction of a second (generally 100 to 1000 msec), the radiation still emitted from the filament delays the start of controlled cool down or ramp down. Accordingly, a better way to expedite temperature ramp down following heating in rapid thermal processing is sought.

SUMMARY OF THE INVENTION

The rapid thermal processing (RTP) system according to the invention provides a controlled pressure and temperature environment for processing substrates, such as semiconductor wafers and integrated circuits. The apparatus includes a heating chamber and an array of heat lamps that generate radiant heat for maintaining the temperature of a semiconductor wafer held within the chamber at a selected value or range of values according to a desired heating recipe. Each heat lamp includes a bulb, and at least such bulb is surrounded by an optically transparent enclosure that isolates the bulb from the interior of the chamber and the wafer therein. Preferably, the optically transparent enclosure is formed from quartz and has a surface completely or substantially transparent to the radiant heat energy emitted by the bulb. By isolating the chamber interior and the wafer therein from the bulb and associated components of the heating lamp, the optically transparent enclosure helps prevent contaminants from the heating lamps from entering the chamber or being deposited on a semiconductor wafer in the chamber.

In another aspect of the invention, improved temperature control is realized by using heat lamps with bulbs having a reflector surface disposed over at least a portion of the bulb surface or disposed over at least a portion of the optically transparent enclosure. The reflectors help to control and direct radiation from the lamps to the surface of a semiconductor wafer under process. Alternatively, the reflector surface may be found on the wall of the chamber, particularly within a cavity in the chamber wall with a concavely-shaped or parabolic-shaped inner surface. When the heat lamps are positioned within the cavity, the reflector surface on the cavity wall helps to control and direct radiation from the lamps to the surface of a semiconductor wafer under process.

In yet another aspect of the invention, an apparatus for rapid thermal processing of a semiconductor substrate, such as a semiconductor wafer, or a system for processing one or multiple semiconductor substrates, has a chamber defining a volume into which the semiconductor substrate is introduced for heating by one or more heating lamps. Preferably each heating lamp is isolated from the chamber volume by an optically transparent envelope that has an associated reflector. The envelope may be rotated about its longitudinal axis from a first position in which the reflector directs radiant heat energy emitted by the heating lamp toward the substrate to a second position wherein the reflector shields the substrate from a portion or all of the radiant heat emitted by the heating lamp. The rotation of the envelope may be accomplished independently or together with rotation of the lamp bulb. Preferably, the second position of the reflector is where the optically transparent enclosure has been rotated from 120 degrees to 180 degrees either clockwise or counter-clockwise about its longitudinal axis.

Preferably, the optically transparent enclosure forms a generally cylindrical tube and the reflector associated with the optically transparent envelope is a reflective coating applied over the internal surface of the optically transparent envelope in an arc of from about 90 degrees to about 180 degrees. Optionally, the reflective coating may be applied over the internal surface of the optically transparent envelope to form an elliptic arc with a substantially uniform coating thickness along the arc. Preferred reflective coating materials for coating the envelope include, but are not limited to metallic gold or other infrared reflective coatings, such as $TiO_2$.

Preferably, the means for rotating the optically transparent envelope are sleeve or ball bearings and an associated motor. For example, a first sleeve with associated ball bearings may be mounted at the first end of the envelope and a second sleeve with associated ball bearings may be mounted at the second end of the envelope, and a motor may be operatively connected thereto.

Alternatively, the reflector associated with the optically transparent envelope is a reflective coating applied to an external surface of the heating lamp, preferably in an arc of from about 90 degrees to about 120 degrees. Optionally, the reflective coating is applied in a substantially uniform coating thickness. Preferred reflective coating materials for coating the surface of the heating lamp bulb include, but are not limited to metallic gold or other infrared reflective coatings, such as $TiO_2$. In this alternative embodiment, the lamp may be rotated about its longitudinal axis from a first position where the reflector directs radiant energy toward the substrate to a second position from 120 degrees to 180 degrees either clockwise or counter-clockwise, wherein the reflector shields the substrate from a portion or all of the radiant energy. In such alternative embodiment, the means for rotating are associated with the lamp, or with both the lamp and the optically transparent envelope or enclosure.

Still another aspect of the invention is a method for rapid thermal processing of a semiconductor substrate or multiple semiconductor substrates, such as one or more semiconductor wafers. In the method, a portion or all of the radiant energy emitted by a heating lamp is alternately reflected toward and shielded away from the substrate held within a chamber volume with a reflector associated with an optically transparent envelope, which envelope isolates the heating lamp from the substrate in the chamber volume. The reflector reflects radiant energy when the reflector is in a first position and the reflector shields a portion or all of the radiant energy from the substrate when the reflector is in a second position.

Preferably, the optically transparent enclosure forms a generally cylindrical tube and the reflector associated with the optically transparent envelope is a reflective coating applied over the internal surface of the optically transparent envelope in an arc of from about 90 degrees to about 180 degrees. Preferably, the reflective coating is a material such as metallic gold, or other infrared reflective coatings, such as $TiO_2$. Where the reflector is a reflective coating on the optically transparent enclosure or envelope around the lamp bulb, shielding is by rotating the optically transparent enclosure about its longitudinal axis from a first position to a second position that is from 120 degrees to 180 degrees of clockwise or counter-clockwise rotation.

Alternatively, the reflector associated with the optically transparent envelope is a reflective coating applied to an external surface of the heating lamp, preferably in an arc of from about 90 degrees to about 120 degrees. Preferred reflective coating materials for coating the surface of the heating lamp bulb include, but are not limited to metallic gold or other infrared reflective coatings, such as $TiO_2$. In this alternative embodiment, the lamp may be rotated about its longitudinal axis from a first position where the reflector directs radiant energy toward the substrate to a second position from 120 degrees to 180 degrees either clockwise or counter-clockwise, wherein the reflector shields the substrate from a portion or all of the radiant energy. In such alternative embodiment, the means for rotating are associated with the lamp, or with both the lamp and the optically transparent envelope or enclosure.

Shielding radiation from the substrate by rotating the optically transparent enclosure with the reflector, the lamp with reflector or both the lamp and the optically transparent enclosure with reflector may be partial or complete, depending upon the extent to which the reflector shields the substrate from radiation. The method may be used to controllably cool a substrate after the substrate has reached its peak heating temperature. Thus, the heating lamp may be deactivated before rotating lamp or enclosure with associated reflector to shield the substrate from radiation. Alternatively, the lamp or enclosure with associated reflector may be rotated into position for shielding radiation before lamp power has been switched off. Preferably, the substrate is shielded from radiation by placing the reflector in the second or shielding position within –[minus] 100 msec before to +[plus] 500 msec after the substrate has reached its desired peak surface temperature.

Still other objects and advantages of the present invention will become readily apparent to those skilled in the art from the following detailed description of the preferred embodiments of the invention. As will be realized, the invention is capable of other and different embodiments, and its several details are capable of modifications in various obvious respects, without departing from the invention. Accordingly, the description is to be regarded as illustrative in nature and not as restrictive.

DESCRIPTION OF THE FIGURES

FIG. 2 is a section view of a rapid thermal processing system in accordance with a preferred embodiment of the invention;

FIG. 2A is a partial cross-sectional view in side elevation taken along line 2A to 2A of FIG. 2.

FIG. 3 is a section view of an alternate embodiment of the rapid thermal processing system;

FIG. 4 is a section view of a heat lamp for directing radiant energy to a semiconductor wafer within the rapid thermal processing system;

FIG. 5 is a section view of an alternate embodiment of the heat lamp for directing radiant energy to a semiconductor wafer within the rapid thermal processing system;

FIG. 6 is a section view of a heat lamp having a reflector for directing radiant energy;

FIG. 7 is a section view of a heat lamp having another arrangement for directing radiant energy to a semiconductor wafer in a rapid thermal processing system.

FIG. 8 is a section view of a heat lamp with yet another arrangement of a reflector for directing radiant energy to a semiconductor wafer in a rapid thermal processing system;

FIG. 9 is a cross-section view of an array of heat lamps embedded within the wall of a rapid thermal processing system chamber;

FIG. 10A is a section view of the heat lamp and quartz enclosure supported on the chamber wall of a rapid thermal processing system;

FIG. 10B is a section view of the quartz enclosed heat lamp in an alternate arrangement partially embedded in the chamber wall;

FIG. 10C is a section view of the quartz enclosed heat lamp in yet another alternate arrangement completely embedded in a cavity in the chamber wall;

FIG. 10D is a section view of the heat lamp embedded within a cavity in the chamber wall and with a quartz window covering an opening to the cavity;

FIG. 10E is a section view of the heat lamp embedded in the chamber wall and having a lens for controlling dispersion of radiant energy emitted from the lamp;

FIG. 10F is a section view of multiple lamps within a single quartz enclosure supported on the chamber wall;

FIG. 11A is a section view of a point lamp enclosed by a quartz lens;

FIG. 11B is a section view of a lamp embedded in a light pipe and enclosed by a quartz lens;

FIG. 11C is a section view of a lamp within a light pipe and having a lens at the distal end of the light pipe;

FIG. 11D is a section view of an alternate arrangement with a lamp embedded in a cavity in the chamber wall and surrounded by a quartz lens;

FIG. 12 is a section view of a heat lamp in a diverging quartz lens;

FIG. 13 is a section view of an alternate embodiment having a lamp within a quartz enclosure surrounded by a cooling source and embedded in a cavity in the chamber wall;

FIG. 14 is a bottom plan view of the chamber wall of an alternate rapid thermal processing system according to the invention showing point lamps held within channels in the chamber wall, wherein said channels are covered with optically transparent enclosures;

FIG. 17 is a section view of yet another alternate rapid thermal processing system in accordance with a preferred embodiment of the invention, showing means for rotating the quartz tubes enveloping each heat lamp;

FIG. 18 is a view in side elevation of a heat lamp enveloped by a quartz tube, which tube is mounted to ball bearings at each end for rotating the tube;

FIG. 19 is a section view of a heat lamp for directing radiant energy to a semiconductor wafer within the rapid thermal processing system, having a reflective surface coating a portion of the quartz tube enveloping the lamp bulb.

FIG. 20 is a section view of the heat lamp of FIG. 19 shown after the tube has been rotated 180° about its axis;

FIG. 21 is a section view of an alternate heat lamp for directing radiant energy to a semiconductor wafer within the rapid thermal processing system having an alternate reflective surface coating a portion of the quartz tube enveloping the lamp bulb; and FIG. 22 is a section view of a heat lamp for use in a rapid thermal processing system, said heat lamp having a reflective surface directly coating a portion of the lamp bulb.

DESCRIPTION OF THE PREFERRED EMBODIMENTS

Figure 1:
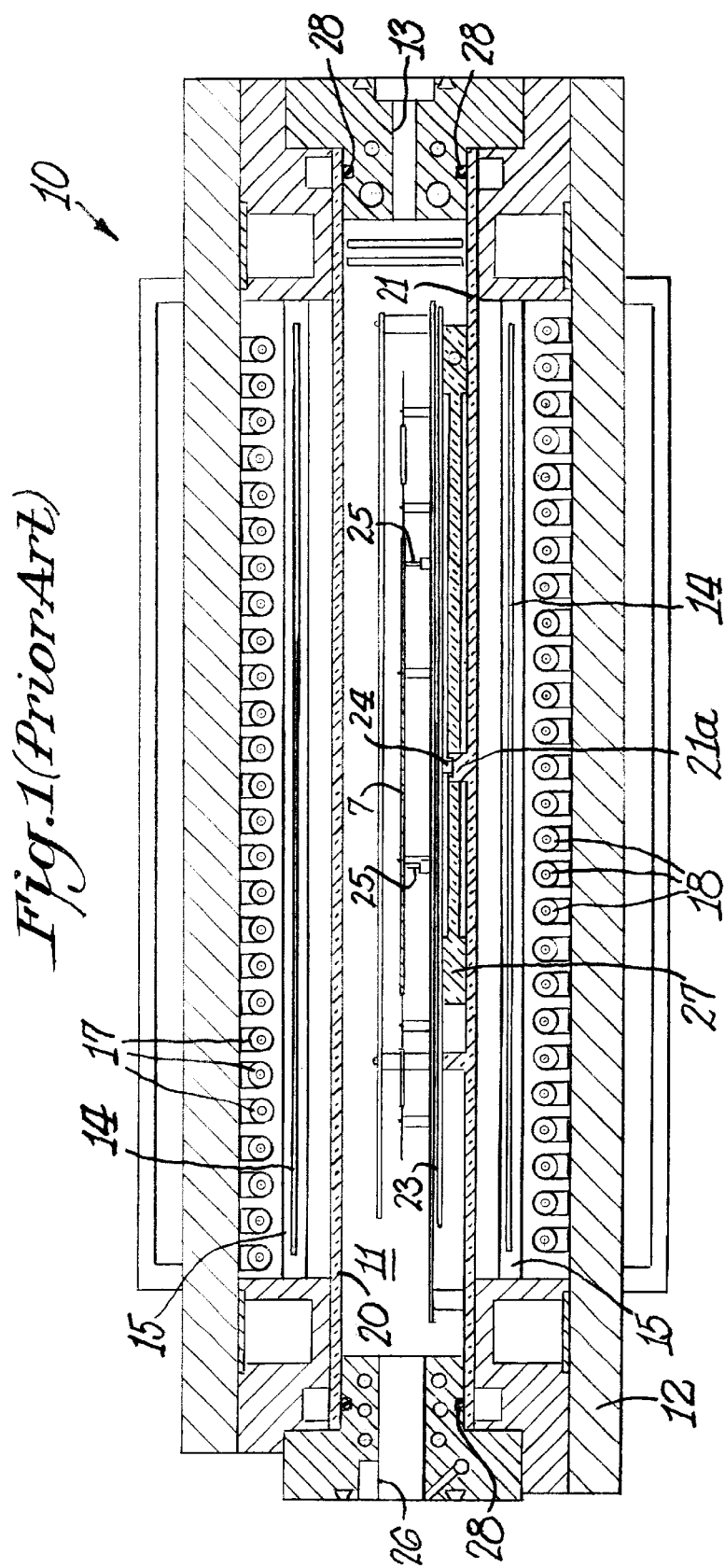
FIG. 1 illustrates a conventional prior art rapid thermal processing system providing a controlled temperature and pressure environment for semiconductor wafers.

In accordance with the prior art, FIG. 1 is a longitudinal section view of an apparatus 10 for performing rapid thermal processing (RTP) of a semiconductor wafer 7. The apparatus 10 provides a housing 12 defining a central chamber 11 in which a wafer is placed for processing. Door slot 26 at a first end of vacuum chamber 11 permits the wafer 7 to be loaded into the chamber 11 and located on supporting pins 25 on the rotor 23. The rotor 23 is supported for rotation on a pin 24 fixed to a boss 21a extending from quartz window 21 through an opening in quartz pad 27.

Quartz window 21 forms the lower boundary of the vacuum chamber 11, and is sealed with respect to the remaining chamber components by seals 28. The upper boundary of the chamber 11 is formed with a quartz window 20. Quartz windows 20, 21 are optically transparent and permit radiant heat energy to pass into the chamber 11. Processing gases such as nitric oxide (NO), ammonia ($NH_3$), or $N_2O$ are introduced into the chamber 11 during the wafer processing through an opening 13 at a second end of the chamber 11.

The radiant heat source for the apparatus 10 comprises first and second substantially parallel lamp arrays 17 and 18 located within the housing 12, but outside of the chamber 11, and supported by the inner walls of the apparatus 10. Additional radiant heat is provided by longitudinal side lamps 14 having reflectors 15 supported by the wall of the apparatus 10. A vacuum port (not shown) permits a vacuum to be drawn within the chamber 11, resulting in significant atmospheric forces acting against the quartz windows 20 and 21.

The quartz windows 20 and 21 have a sufficient thickness with adequate mechanical strength to isolate the chamber from any external contamination. They are usually at least 3 mm to 6 mm thick. As the demands for larger semiconductor wafer sizes and higher wafer throughput in the rapid thermal processing system increase, the cross sectional area increases. In addition, low pressure process chambers are required to be compatible with vacuum load-locks and wafer transfer modules to enhance throughput. The thickness of quartz windows 20 and 21 required for low pressure RTP apparatus will need to be significantly increased to meet these requirements. When a vacuum is drawn in the RTP chamber, an atmospheric force of between two and four tons is produced against the quartz windows. These windows must be thick enough to withstand this force, and are generally from 25 mm to 35 mm thick. As the thickness of the quartz windows increases, the distance between the arrays of heating lamps 17, 18 and the chamber 11 also increases. Moreover, the thicker windows provide a large thermal mass, making control over the wafer temperature more difficult. Therefore, the present inventors sought to overcome these disadvantages.

In accordance with one preferred embodiment of the invention, the quartz windows 20, 21 of conventional RTP apparatus (FIG. 1) may be eliminated. Referring now to FIG. 2, the RTP apparatus 60 of the first embodiment of the invention has a chamber 62 that includes wafer holders 65 to support the semiconductor wafer 64 during thermal processing. Wafer 64 is loaded into the chamber 62 through a door slot or opening 67. Optically transparent liners 66 and 68, which may be quartz, do not form a pressure sealing surface with the chamber 62, but are supported within the chamber 62 so that the pressure is equalized on each side of the liners 66 and 68. Thus, the liners 66 and 68 may be thinner, and have less thermal mass, than the conventional chamber quartz windows that must sustain large atmospheric pressure differentials but still assist in maintaining the wafers free of contamination. The liners have a thickness preferably of about 0.25 mm to 2.0 mm, most preferably of about 1.0 to 2.0 mm, and may be formed of silicon carbide (SiC), quartz or other glass or ceramic materials that are optically transparent and able to withstand typical rapid thermal processing temperatures, that can exceed 1000° C.

In the embodiment of FIG. 2, first and second arrays of light sources, such as tungsten halogen heating lamps or Xenon arc lamps, are provided along the top and bottom of the chamber 62, i.e., above and below the wafer supports 65. The arrays of light sources along the top and bottom of the chamber 62 supply direct radiant heat to the wafer 64 as the wafer is held on the wafer supports 65. Each light source includes a linear lamp 70, 72 within an optically transparent enclosure (such as a quartz tube) 74, 76 on the top and bottom of chamber 62. The quartz tubes 74, 76 individually surround each lamp 70, 72, and are sealed to the sidewalls of chamber 62 with seals 78, 80, thus maintaining both the area surrounding the quartz tubes 74, 76 and the remaining portion of the chamber 62 at the same pressure, preferably under vacuum. The top and bottom walls 91, 93 of the chamber 62 may be coated with a reflective coating 69, such as metallic gold or other infrared reflective coatings, such as $TiO_2$ and $Al_2O_3$. As best seen in FIG. 2A, the lamps 70, 72 preferably are disposed in parallel relation, with each enclosed lamp spaced apart only slightly from an adjacent enclosed lamp, and spaced apart from the top wall and bottom wall, respectively, of the chamber and reflective coating 69. While each of the arrays are shown in parallel, it is of course possible to have the arrays oriented in a perpendicular or other non-parallel relationship. In addition, a first parallel array adjacent to the top wall 91 of the chamber may be parallel to a second parallel array adjacent to the bottom wall 93 of the chamber. Nevertheless, the lamps of the second parallel array may be arranged transversely to the lamps of the first parallel array.

Individual cooling channels having an inlet 82 and an outlet 84 circulate cooling fluid, such as a liquid like water or a cooling oil, or a gas with suitable thermal conductivity like air, or a mixture of air and helium or hydrogen, through each quartz tube 74, 76 to cool the lamps 70, 72. The cooling fluid may have light refractive properties, and the path of flow of the cooling fluid may be designed to direct radiant heat or light emitted from the lamp bulbs 70, 72 toward the semiconductor wafer 64.

As shown in FIGS. 2 and 2A, the chamber 62 has first and second arrays of quartz enclosures 74, 76, with each quartz enclosure containing a respective lamp 70, 72. The quartz enclosures 74, 76, and liners 66, 68, help to isolate the lamp bulbs from the chamber 62 so as to maintain the inner portion of the chamber 62 that houses the wafer during RTP processing free from contaminants without introducing large thermal masses between the light source(s) and the wafer.

Optional vacuum lines 101 may be used to evacuate gases from the chamber 62 to draw a vacuum within the chamber. The vacuum lines are shown in phantom outline in FIG. 2A.

Although not shown in FIG. 2, it is of course possible to use liners with different thicknesses to isolate the first and second lamp arrays from the chamber 62. For example, a thinner liner with a nominal thickness of 0.25 mm may be suitable to isolate the first lamp array, and may have the advantage of permitting a faster temperature response and higher temperature ramp up.

FIG. 3 is a section view of an alternate embodiment 90 of the invention which provides for additional contamination protection for a wafer 64 supported on the wafer supports 65. In the embodiment of FIG. 3, windows 86 and 88 fully extend to the sides of the housing defining the chambers 62, 95 to form a sealed enclosure for the wafer supports 65 to better isolate the wafer 64 and wafer supports 65 from contaminants that might be emitted by the lamps 70, 72 or enclosures 74, 76 surrounding the lamps. To maintain pressure equilibrium on each side of the windows 86 and 88, thereby avoiding the need for thick and thermally massive quartz windows as were used in prior art RTP apparatus, the pressures on both sides of quartz windows 86 and 88 are controlled. In the embodiment shown in FIG. 3, a vacuum is drawn through pressure pump 92, and regulators 94 and 96 equalize the pressure on each side of the window plates 86 and 88 through conducting lines 98, 100 and 102. Appropriate seals 104 between the sidewalls of the chambers 62 and 95 and the windows 86, 88 maintain a substantially contaminant free environment under vacuum within the chambers 62 and 95.

As a further enhancement to the apparatus for rapid thermal processing, the amount of radiant energy delivered from the lamps 70, 72 to the chamber 62 containing the wafer 64 may be optimized by varying the characteristics of the envelope encompassing the lamp bulbs. FIG. 4 represents a section view of one of the transparent enclosures 74 from one of the lamp arrays 70. In this embodiment, the transparent enclosure is a quartz tube 74a that has been coated on an inner surface with a reflective coating 106 that helps to direct radiant energy from the bulb 70 to the wafer 64 on the wafer supports 65. Preferred reflective coating materials are gold, or other infrared reflective coatings, such as $TiO_2$ and $Al_2O_3$. The inner reflective coating 106 is shown covering less than 180° of the quartz tube 74a as defined by angle A in FIG. 4. Preferably, angle A is within the range of about 160° to 180°. By controlling the radiant energy intensity within the area in which the wafer is processed, improved temperature stability may be realized, resulting in better process repeatability.

FIG. 5 is a section view of an alternative arrangement in which a reflective coating 108 is applied to the outside surface of a lamp bulb 70a to direct radiant energy towards the wafer held within the chamber 62.

FIG. 6 shows in section view another embodiment in which a reflective coating 110 is applied to coat the outside surface of the transparent enclosure 74b surrounding the lamp bulb 70. Coating the outside surface directs radiant energy toward the wafer in the chamber 62, but with a different pattern than that produced when a coating 106 is applied to the inner surface of the transparent enclosure 74a (shown in FIG. 4).

A parabolic reflector 112 may be provided adjacent to the transparent enclosure 74 surrounding the bulb 70. As shown in FIG. 7, the parabolic reflector 112 serves to direct emitted radiation toward the wafer in straighter, more parallel paths, as compared to the reflective coating 110 applied to the outside surface of the transparent enclosure in FIG. 6, which reflects radiation in more divergent paths. Parabolic reflectors that direct emitted radiation toward the wafer in straighter, more parallel paths are preferred.

The benefits of straighter, more parallel paths for radiation may be obtained even when the reflective coating 110 is applied to the outer surface of the transparent enclosure 74b by introducing straight reflectors 114 adjacent to the transparent enclosure 74b as shown in FIG. 8. The straight reflectors 114 in combination with the reflective coating serve to direct the emitted radiation toward the semiconductor wafer. When the reflectors 114 are disposed between adjacent transparent enclosures in an array of enclosed lamps, the reflective surfaces of the reflectors 114 redirect some divergent radiation rays toward the wafer 64 in the chamber 62.

The top and bottom walls of the apparatus 60 or 90 alternatively may be formed as one or a series of channel-like cavities of parabolic reflective shapes 116, as shown best in FIG. 9. FIG. 9 is a cross section of taken from an end elevation of the upper portion of a chamber. In such an embodiment, each lamp 70 enclosed within a transparent enclosure 74 is held within a parabolic channel 116 formed within the chamber wall 93. With fewer separate parts for assembly, this embodiment may produce fewer contaminants than when the reflective structure is formed from separate parts or separate coatings associated with the transparent enclosures around the lamps. In addition, the openings of the parabolic channels 116 may also be covered with an optically transparent window (not shown in FIG. 9).

The foregoing embodiments, which provide for individual sealing of linear lamps with optically transparent enclosures, such as quartz tubes, eliminate the thicker and expensive quartz plates or windows used in conventional systems. Moreover, the optically transparent enclosures around the lamps can have cross-sectional shapes that improve the ability of the enclosures to withstand higher atmospheric pressures. For example, circular or parabolic cross-sectional shapes can withstand greater pressures than other cross sectional shapes with flatter surfaces. Nevertheless, other cross sectional shapes may also be used depending on the extent of the vacuum drawn or pressure differential between the chamber interior and exterior.

FIGS. 10A–10F illustrate various embodiments for supporting a linear lamp 70 on or within the wall 93 of the chamber 62. FIG. 10A shows a bulb 70 surrounded by a quartz tube 74 and positioned closely adjacent to the side wall 93 of the chamber. Alternatively, FIG. 10B shows a bulb 70 surrounded by a quartz tube 74, wherein the tube is embedded partially within a cavity formed within the sidewall 93 of the chamber. As yet another alternative, FIG. 10C shows a bulb 70 surrounded by a quartz tube 74, wherein the tube is completely embedded within an arcuate cavity 118 formed within the sidewall 93 of the chamber. The arcuate cavity 118 has a depth sufficient to hold the entire tube 74.

In FIG. 10D the bulb 70 is held within a cavity 118 with an arcuate base. The opening of the cavity 118 is sealed with a flat cover 120 formed of optically transparent material, such as quartz. In such embodiment, there is no tube enclosing the bulb, but the bulb is isolated from the interior of the chamber by the cover 120. As an alternate to this approach, in FIG. 10E, the bulb 70 is held within a cavity 118 with an arcuate base formed within the wall 93 of the chamber, and a curved cover 122 of transparent material, such as quartz, seals the cavity opening. The curved cover 122 is preferably shaped as a convexly curved lens, to help focus and direct radiant energy from the lamp bulb 70 to the wafer held within the chamber.

Further efficiencies may result by enclosing multiple lamp bulbs within a single transparent enclosure. FIG. 10F shows bulbs 70c and 70d enclosed within quartz tube 74. The tube 74 is positioned closely adjacent the wall 93 of the chamber. Multiple lamps in a lamp array may be used as a heating source in the RTP system, but the benefits of the invention do not require a one to one relationship between the transparent enclosure and the bulb surrounded by such enclosure.

Rather than a tube-like structure, the optically transparent enclosure may be formed in other geometric shapes with varying cross-sections. For example, in FIG. 12, the bulb 70 may be held within a cavity formed within a solid piece 124 of an optically transparent material. The solid piece is attached to the wall 93 of the chamber, and has been shaped on one side to form a concavely curved lens to help direct and focus radiant energy emitted by the bulb 70.

In yet another embodiment shown in FIG. 13, a solid block 126 of optically transparent material is held within a cavity 130 formed within the wall 93 of the chamber. A bulb 70 is held within a hollow portion of the solid block. The cooling channels 128 are provided within the cavity 130 and around the solid block 126 to permit flow of a cooling fluid, such as liquid or gas, to help to cool the block 126 and the lamp bulb 70. Preferably, the cooling channels 128 are held within a potting or sealing material 129 that seals the block 126 within the cavity 130.

The principle of the invention can be equally applied to point lamps, rather than the linear lamps shown in the embodiments of FIGS. 2 and 3. The top wall 144 of an RTP system 140 that uses point lamps 142 as the heating source is shown in FIG. 14. In such an embodiment, the bulbs 142 are held within sockets so that the bulb portion extends perpendicularly to the semiconductor substrate, such as a semiconductor wafer, held within a chamber for processing. As shown in FIG. 14, the bulbs are aligned in rows and held within troughs. As one embodiment of the invention using an RTP system 140 with point lamps 142, strips of transparent optical enclosure material (not shown) cover the troughs holding the bulbs to isolate the bulbs from the chamber holding the wafer to be processed.

Alternatively, as shown in FIG. 11A, each individual lamp bulb 142 held within a socket (not shown) in the wall 144 can be enclosed within an optically transparent enclosure 146 to isolate the lamp 142 from the interior of the chamber.

To help direct radiant energy emitted from the lamp bulb 142 toward the wafer to be processed, the bulb 142 may be held within a light pipe 148, and the bulb and light pipe together enclosed within an optically transparent enclosure as shown in FIG. 11B. In FIGS. 11A and 11B, the optically transparent enclosure 146 has a curved or parabolic shape to better withstand pressures and forces thereupon when the pressure is changed within the chamber.

FIG. 11C shows the arrangement where an individual point lamp 142 is enclosed within a light pipe 148, wherein the proximal end of the light pipe 148 is attached to the wall 144 of the chamber. The distal end of the light pipe 148 is then enclosed with a curved or parabolic-shaped optically transparent enclosure 150 to seal the cavity formed by the light pipe and the enclosure and isolate bulb 142 from the wafer to prevent contamination from the bulb from reaching the wafer. In FIG. 11D, the point lamp 142 is held within a cavity or recess 152 within the wall 144 of the chamber. A smaller amount of quartz or other optically transparent material may be used in the curved or parabolic-shaped cover 146 to cover the cavity opening and isolate the bulb from the wafer to be processed.

While each of the foregoing embodiments of FIGS. 11A–D is shown with a curved quartz enclosure around the point lights 142 or point lights 142 in combination with a light pipe 148, it is of course possible to locate each of the bulbs within a recess or cavity in the chamber wall 144, and provide a single flat covering of quartz to seal each of the lamps against the pressure differential within enclosure.

The foregoing examples for controlling the dispersion of radiant heat energy from the lamps 70, 72, 142 are exemplary only. It is clear that a judicious selection of the lamps, reflective coatings, and lens surfaces will provide an even higher degree of control over radiant light into the processing chamber. The foregoing illustrations and descriptions of the preferred embodiments have shown these relationships as fixed. Nevertheless, they may be augmented by positioning devices which move the radiant lamps with respect to reflective surfaces and lenses. While the positions of these elements for controlling light/energy dispersion from the lamps has been described in the context of uniform light distribution over the interior surface of a wafer held within the chamber, such as chamber 62 or chamber 91, it is clear that the lamps and lamp arrays may be positioned to control the temperature profile within the enclosure.

Figure 15:
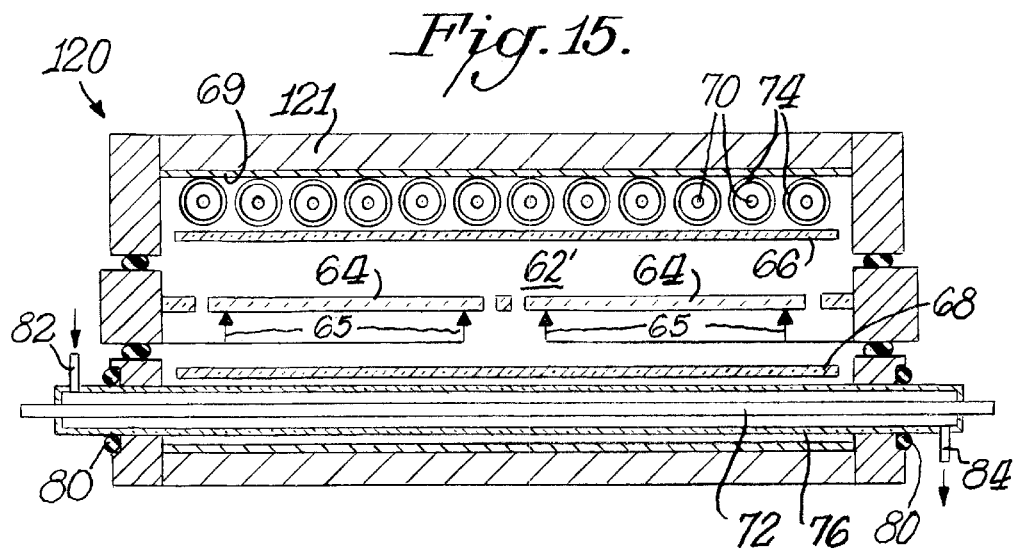
FIG. 15 is a section view of another alternate rapid thermal processing system in accordance with a preferred embodiment of the invention, showing two wafers held within the chamber.

Another alternate embodiment of the invention is shown in FIG. 15. In this embodiment, throughput is increased by placing two semiconductor wafers 64 onto wafer holders 65 within the chamber for simultaneous processing. Optically transparent liners 66 and 68, which may be quartz, do not form a pressure sealing surface with the chamber 62', but are supported within the chamber 62' so that the pressure is equalized on each side of the liners 66 and 68. First and second arrays of light sources, such as tungsten halogen heating lamps or Xenon arc lamps, are provided along the top and bottom of the chamber 62', i.e., above and below the wafer supports 65. The arrays of light sources along the top and bottom of the chamber 62' supply direct radiant heat to the wafers 64 as the wafers are held on the wafer supports 65. Each light source includes a linear lamp 70, 72 within an optically transparent enclosure (such as a quartz tube) 74, 76 on the top and bottom of chamber 62'. The quartz tubes 74, 76 individually surround each lamp 70, 72, and are sealed to the sidewalls of chamber 62' with seals 78, 80, thus maintaining both the area surrounding the quartz tubes 74, 76 and the remaining portion of the chamber 62 at the same pressure, preferably under vacuum. The lamps 70 in the upper array are arranged in a direction perpendicular to the lamps 72 in the lower array.

Individual cooling channels having an inlet 82 and an outlet 84 circulate cooling fluid, such as a liquid like water or a cooling oil, or a gas with suitable thermal conductivity like air, or a mixture of air and helium or hydrogen, through each quartz tube 74, 76 to cool the lamps 70, 72. The cooling fluid may have light refractive properties, and the path of flow of the cooling fluid may be designed to direct radiant heat or light emitted from the lamp bulbs 70, 72 toward the semiconductor wafer 64.

The top and bottom walls 91, 93 of the chamber 62 may be coated with a reflective coating 69, such as metallic gold or other infrared reflective coatings, such as $TiO_2$ and $Al_2O_3$.

As shown in FIG. 15, the chamber 62' has first and second arrays of quartz enclosures 74, 76, with each quartz enclosure containing a respective lamp 70, 72. The quartz enclosures 74, 76, and liners 66, 68, help to isolate the lamp bulbs from the chamber 62 so as to maintain the inner portion of the chamber 62 that houses the wafers during RTP processing free from contaminants without introducing large thermal masses between the light source(s) and the wafers.

Figure 16:
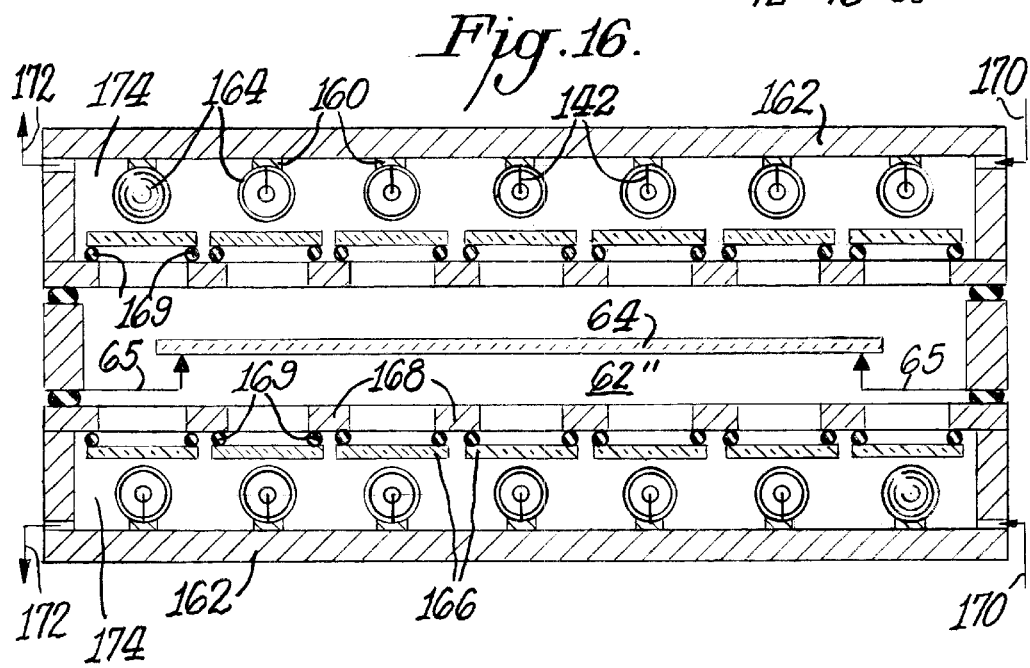
FIG. 16 is a section view of yet another alternate rapid thermal processing system in accordance with a preferred embodiment of the invention, showing a series of optically transparent liners in combination with a series of point-source heating lamps.

FIG. 16 shows yet another alternate embodiment of the apparatus, in which a plurality of point lamps 142 held within sockets 160 mounted in the outer walls 162 of the chamber 62" are positioned to direct radiant energy toward a wafer 64 held on wafer supports 65 within the chamber 62". The point lamps 142 preferably are surrounded by quartz envelopes 164 to minimize emission of contaminates. In addition, a series of optically transparent liners 166, preferably of quartz, are placed over openings in the inner wall 168 of the chamber 62" to further shield the point lamps 142 from the wafer 64 held within the chamber 62". The liners 166 are sealed to the inner wall 168 with seals 169. Preferably, channels 170, 172 formed in the chamber walls permit cooling fluid, such as a gas, to be circulated past the point lamps 142 to cool the lamps 142. These channels 170, 172 also permit gases to be introduced into and removed from the chamber 62" to help stabilize or equalize the pressure in the portions 174 of the chamber 62" enclosing the point lamps 142 and the portion of the chamber 62" enclosing the wafer 64 for processing.

Referring next to FIG. 17, an RTP apparatus 260 has a chamber 262 that includes wafer holders 265 to support the semiconductor wafer 64 during thermal processing. Wafer 64 is loaded into the chamber volume 262 through a door slot or opening 267. Optically transparent liners 266 and 268, which may be quartz, do not form a pressure sealing surface with the chamber 262, but are supported within the chamber 262 so that the pressure is equalized on each side of the liners 266 and 268. Thus, the liners 266 and 268 may be thinner, and have less thermal mass, than more conventional chamber quartz windows that must sustain large atmospheric pressure differentials but still assist in maintaining the wafers free of contamination. The liners may be formed of silicone carbide (SiC) or other ceramic materials that are optically transparent and able to withstand typical rapid thermal processing temperatures that can exceed 1000° C.

In FIG. 17, first and second arrays of light sources, such as tungsten-halogen heating lamps or Xenon arc lamps, are provided along the top and bottom of the chamber 262, i.e. above and below the wafer supports 265. The arrays of light sources along the top and bottom of the chamber 262 supply direct radiant heat to the wafer 64 as the wafer is held on the supports 265. Each light source includes a linear lamp 270, 272 within an optically transparent envelope or enclosure (such as a quartz tube) 274, 276 on the top and bottom of chamber 262. The quartz tubes 274, 276 individually surround each lamp 270, 272 and are sealed to the sidewalls of chamber 262, with seals 278, 280, thus maintaining both the volume surrounding the quartz tubes 274, 276 and the remaining portion of the chamber 262 at the same pressure, preferably under vacuum.

Each lamp 270, 272 preferably is a cylindrical tube defining a central longitudinal axis. Each optically transparent envelope 274, 276 preferably is a cylindrical tube defining a central longitudinal axis. As shown in FIGS. 17 and 18, each end of the envelopes 274, 276, is engaged by a set of self adjusting bearings like roller bearings or ball bearings 292 held within a sleeve 290 to permit each optically transparent enclosure 274, 276 to rotate either clockwise or counter-clockwise about its axis. The bearings 292 and sleeves 290 preferably can be formed from metals, such as stainless steel, or ceramics or plastics (such as polytetrafluoroethylene (e.g. TEFLON), and have ability to withstand temperatures up to 400° C. and still function to permit rotation of the optically transparent envelopes 274, 276.

A motor 300 actuatably connected to one or more of the optically transparent envelopes 274, 276, rotates the envelopes. Suitable motors for such purpose may be obtained from Baldor Electric Co., EAD Motors or Oriental Motor USA Corp. Rotation speed preferably can be greater than 60 rpm to turn the lamp or envelope one half revolution in 500 msec. The very quick rotation is required only in one direction, either clockwise or counter-clockwise. Thus, it is also possible to control the rotation with a quick release spring-like mechanism to cause rapid rotation in combination with a motor or crank to return the lamp or sleeve to its starting position.

Returning to FIG. 17, the top and bottom walls 291, 293 of the chamber 262 may be coated with a reflective coating, such as metallic gold or other infrared reflective coatings, such as $TiO_2$ and $Al_2O_3$.

Individual cooling channels having an inlet 282 and an outlet 284 circulate cooling fluid, such as a liquid like water or a cooling oil, or a gas with suitable thermal conductivity, like air or a mixture of air and helium or hydrogen, through each quartz tube 274, 276 to cool the lams 270, 272. The cooling fluid may have light refractive properties, and the path of flow of the cooling fluid may be designed to direct radiant heat or light emitted from the lamp bulbs 270, 272 toward the semiconductor wafer 64. Optional vacuum lines (not shown) may be used to evacuate gases from the chamber 262 so as to draw or maintain a vacuum within the chamber.

FIGS. 19 and 20 show section views of one of the transparent enclosures 274 from one of the lamp arrays 270. In this embodiment, the transparent envelope 274 is a quartz tube that has been coated on an inner surface with a reflective coating 206 that in a first position helps to direct radiant energy from the bulb 270 toward the wafer 64 on the wafer supports 265. Preferred reflective coating materials are gold, or other infrared reflective coatings, such as $TiO_2$. The inner reflective coating 206 is shown as an arc covering less than 180 degrees of the quartz tube 274 as defined by angle θ in FIG. 19. Preferably, angle θ is within the range of about 120 degrees to 180 degrees. By controlling the radiant energy intensity within the area in which the wafer is processed, improved temperature stability may be realized, resulting in better process repeatability.

The reflective coating 206 is applied in an arc and in a substantially uniform coating thickness. Preferably the coating thickness is between about 1 to 3 $\mu$m (microns).

Comparing FIGS. 19 and 20, the optically transparent envelope 274 is shown in FIG. 19 in a first position wherein radiant energy emitted from the lamp is reflected back toward a wafer or substrate held within the chamber. In FIG. 20, the same tube 274 has been rotated 180 degrees such that the wafer or substrate in the chamber is shielded from radiant energy emitted from lamp 270. While FIG. 20 has been shown with tube 274 rotated 180 degrees, radiant energy may be effectively shielded partly or wholly by rotating tube 274 from 120 degrees to 180 degrees. Tube 274 may be rotated clockwise or counterclockwise or in both rotational directions, as desired.

Shielding of radiation from lamp 270 may be complete or partial, as desired. Full shielding may be used preferably to help better control the ramp down cooling of a wafer processed by rapid thermal processing. Once the wafer has been heated to a desired peak temperature, the lamps may be deactivated. However, the lamp filaments remain hot for a fraction of a second after deactivation. The reflector formed by reflective coating 206 may be interposed between the lamp filament and the wafer either just before or just after the wafer reaches its desired peak temperature to immediately shield the wafer from the filament and any residual radiation emitted therefrom.

Referring next to FIG. 21, the reflective coating 306 may be applied to the internal wall surface of optically transparent envelope 274 in an elliptic arc with a substantially uniform coating thickness. If coating thickness varies, however, such variations should not impact the speed of rotation and the shielding effectiveness of the reflector formed by the reflective coating.

The reflector associated with the optically transparent envelope and lamp may also be formed as a reflective coating 406 applied to an external surface of the lamp bulb 270. As shown in FIG. 22, a reflective coating 406 has been applied around a portion of the external surface of bulb 270, forming an arc of angle β (beta) of from 120 degrees to 180 degrees. When applied directly to the lamp bulb, the coating material preferably is gold or other infrared reflective coating, such as TiO2, applied to a coating thickness in the range of 1 to 3 $\mu$m (microns).

The invention also comprises such embodiments in which features of the above mentioned embodiments are exchanged and/or combined in whole or in part. The foregoing description of the invention illustrates and describes the preferred embodiments of the invention. Nevertheless, it is to be understood that the invention is capable of use in various other combinations, modifications, and environments and is capable of changes or modifications within the scope of the inventive concept as expressed herein, commensurate with the above teachings and/or the skill or knowledge of the relevant art. The description is not intended to limit the invention to the form disclosed herein. Alternate embodiments apparent to those of skilled in the art are to be included within the scope of the appended claims.

What is claimed is:

1. An apparatus for rapid thermal processing of a semiconductor substrate, comprising:
    a chamber defining a volume into which the semiconductor substrate is introduced, said chamber having a first wall;
    a heating lamp defining a longitudinal axis;
    an optically transparent envelope defining a longitudinal axis, wherein said envelope is capable of being rotated about such axis and isolates the heating lamp from the chamber volume, said optically transparent envelope capable of transmitting therethrough radiant heat energy from the lamp for heating said substrate during processing; and a reflector associated with the optically transparent envelope to direct radiant heat energy emitted by the heating lamp toward said substrate when the reflector is in a first position and to shield said substrate from a portion or all of the radiant heat emitted by the heating lamp when the reflector is in a second position.

2. The apparatus of claim 1, further comprising means for rotating the optically transparent envelope about its longitudinal axis to move the reflector from the first position to the second position.

3. The apparatus of claim 2, wherein the optically transparent envelope has a first end and a second end, and the rotating means comprises a first sleeve with associated bearing mounted at the first end and a second sleeve with associated bearing mounted at the second end.

4. The apparatus of claim 3, further comprising a motor to rotate the optically transparent envelope.

5. The apparatus of claim 1, wherein the reflector associated with the optically transparent envelope is a reflective coating applied to an internal surface of the optically transparent enclosure.

6. The apparatus of claim 5, wherein the optically transparent enclosure forms a generally cylindrical tube and the reflector associated with the optically transparent envelope is a reflective coating applied substantially uniformly over the internal surface of the optically transparent envelope in an arc of from about 90 degrees to about 180 degrees.

7. The apparatus of claim 5, wherein the optically transparent enclosure forms a generally cylindrical tube and the reflector associated with the optically transparent envelope is a reflective coating applied over the internal surface of the optically transparent envelope in an arc of from about 90 degrees to about 180 degrees, wherein the coating varies in thickness along the arc, such that the coating is thicker at a central region of the arc and thinner at end points of the arc.

8. The apparatus of claim 2, wherein the second position of the reflector is where the optically transparent enclosure has been rotated from 120 degrees to 180 degrees about its longitudinal axis.

9. The apparatus of claim 1, further comprising means for rotating the heating lamp about its longitudinal axis to move the reflector from the first position to the second position.

10. The apparatus of claim 9, wherein the heating lamp has a first end and a second end and the rotating means comprises a first sleeve with an associated bearing mounted at the first end and a second sleeve with an associated bearing mounted at the second end.

11. The apparatus of claim 10, further comprising a motor to rotate the heating lamp.

12. The apparatus of claim 1, wherein the reflector associated with the optically transparent envelope is a reflective coating applied to an external surface of the heating lamp.

13. The apparatus of claim 12, wherein the heating lamp is generally cylindrical and the reflective coating is applied over the external surface of the heating lamp in an arc of from about 90 degrees to about 120 degrees.

14. The apparatus of claim 9, wherein the second position of the reflector is where the heating lamp has been rotated from 120 degrees to 180 degrees about the longitudinal axis of the heating lamp.

15. The apparatus of claim 1, wherein the semiconductor substrate is a semiconductor wafer.

16. The apparatus of claim 5, wherein the reflective coating is a material selected from the group consisting of gold and $TiO_2$.

17. The apparatus of claim 12, wherein the reflective coating is a material selected from the group consisting of gold and $TiO_2$.

18. A thermal processing system for processing semiconductor substrates, comprising:
a chamber defining a volume into which one or more semiconductor substrates are introduced;
one or more heating lamps, each lamp defining a longitudinal axis, wherein said heating lamps are aligned in an array;
an optically transparent envelope associated with each heating lamp, said optically transparent envelope isolating the lamp from the chamber volume, said optically transparent envelope capable of transmitting therethrough radiant heat energy from the lamp for heating said substrate during processing; and
a reflector associated with each optically transparent envelope to direct radiant heat energy emitted by the heating lamp toward said substrate when the reflector is in a first position and to shield said substrate from a portion or all of the radiant heat emitted by the heating lamp when the reflector is in a second position.

19. The system of claim 18, further comprising means for rotating each optically transparent envelope about its longitudinal axis to move the reflector from the first position to the second position.

20. The system of claim 18, wherein each reflector associated with its respective optically transparent envelope is a reflective coating applied to an internal surface of the optically transparent enclosure.

21. The system of claim 20, wherein each optically transparent enclosure forms a generally cylindrical tube and the respective reflector associated therewith is a reflective coating applied over the internal surface of the optically transparent envelope in an arc from about 90 degrees to about 180 degrees.

22. The system of claim 19, wherein the second position of each reflector is where the associated optically transparent enclosure has been rotated from 120 degrees to 180 degrees about its longitudinal axis.

23. The system of claim 18, further comprising means for rotating each heating lamp about its longitudinal axis to move the associated reflector from the first position to the second position.

24. The system of claim 18, wherein the reflectors associated with the optically transparent envelopes are reflective coatings applied to an external surface of each heating lamp.

25. The system of claim 24, wherein each heating lamp is generally cylindrical and the reflective coating is applied over the external surface of the heating lamp in an arc from about 90 degrees to about 120 degrees.

26. The system of claim 23, wherein the second position of each reflector is where the heating lamp has been rotated from 120 degrees to 180 degrees about its longitudinal axis.

27. The system of claim 20, wherein the reflective coating is a material selected from the group consisting of gold and $TiO_2$.

28. The system of claim 27, wherein the reflective coating material applied to one optically transparent envelope is different frm the reflective coating material applied to another optically transparent envelope.

29. The system of claim 24, wherein the reflective coating is a material selected from the group consisting of gold and $TiO_2$.

30. The system of claim 29, wherein the reflective coating material applied to one heating lamp is different from the reflective coating material applied to another heating lamp.

31. A method for rapid thermal processing of a semiconductor substrate, comprising:

reflecting a portion of radiant energy emitted by a heating lamp toward the substrate held within a chamber volume with a reflector associated with an optically transparent envelope, which envelope isolates the heating lamp from the substrate in the chamber volume, wherein said reflector is in a first position when reflecting said portion of radiant energy; and shielding the substrate from a portion of radiant energy emitted by the heating lamp with the reflector in a second position.

32. The method of claim 31, wherein the reflector associated with the optically transparent envelope is a reflective coating applied to an internal surface of the optically transparent enclosure.

33. The method of claim 32, wherein the optically transparent enclosure forms a generally cylindrical tube and the reflector associated with the optically transparent envelope is a reflective coating applied over the internal surface of the optically transparent envelope in an arc of from about 90 degrees to about 180 degrees.

34. The method of claim 32, wherein the shielding is by rotating the optically transparent enclosure having a longitudinal axis about its axis from a first position to a second position that is from 120 degrees to 180 degrees of clockwise or counter-clockwise rotation.

35. The method of claim 32, wherein the reflective coating is a material selected from the group consisting of gold and $TiO_2$.

36. The method of claim 31, wherein the reflector associated with the optically transparent envelope is a reflective coating applied to an external surface of the heating lamp.

37. The method of claim 36, wherein the heating lamp is generally cylindrical and the reflector is formed by a reflective coating applied over the external surface of the heating lamp in an arc of from above 90 degrees to about 180 degrees.

38. The method of claim 37, wherein the shielding is by rotating the heating lamp having a longitudinal axis about its axis from a first position to a second position that is from 120 degrees to 180 degrees of rotation either clockwise or counter-clockwise.

39. The method of claim 36, wherein the reflective coating is a material selected from the group consisting of gold and $TiO_2$.

40. The method of claim 31, further comprising:

deactivating the heating lamp before shielding radiant energy with the reflector in the second position.

41. The method of claim 31, further comprising:

spiking the heating energy directed to the substrate surface with the heat lamp or an auxiliary heat source to reach a desired peak substrate surface temperature;

and wherein shielding the substrate is by placing the reflector in the second position within –[minus] 100 msec before to +[plus] 500 msec after the substrate surface has reached its desired peak temperature.

* * * * *